United States Patent
Kim et al.

(10) Patent No.: US 9,054,700 B2
(45) Date of Patent: Jun. 9, 2015

(54) APPARATUS AND METHODS OF DRIVING SIGNAL FOR REDUCING THE LEAKAGE CURRENT

(71) Applicant: Micron Technology, Inc., Boise, ID (US)

(72) Inventors: Gi-Hong Kim, Boise, ID (US); John D. Porter, Meridian, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/223,647

(22) Filed: Mar. 24, 2014

(65) Prior Publication Data
US 2014/0204689 A1    Jul. 24, 2014

Related U.S. Application Data

(62) Division of application No. 13/106,321, filed on May 12, 2011, now Pat. No. 8,681,566.

(51) Int. Cl.
| | |
|---|---|
| G11C 8/00 | (2006.01) |
| G11C 11/34 | (2006.01) |
| H03K 17/16 | (2006.01) |
| G11C 7/10 | (2006.01) |
| G11C 7/12 | (2006.01) |
| G11C 8/08 | (2006.01) |
| G11C 8/10 | (2006.01) |
| G11C 11/419 | (2006.01) |

(52) U.S. Cl.
CPC ............ *H03K 17/162* (2013.01); *G11C 7/1057* (2013.01); *G11C 7/1096* (2013.01); *G11C 7/12* (2013.01); *G11C 8/08* (2013.01); *G11C 8/10* (2013.01); *G11C 11/419* (2013.01)

(58) Field of Classification Search
CPC ..... G11C 8/08; G11C 11/413; G11C 11/4085
USPC ......................................... 365/230.06, 185.23
See application file for complete search history.

(56) References Cited

U.S. PATENT DOCUMENTS

| | | | | |
|---|---|---|---|---|
| 5,274,276 | A | * | 12/1993 | Casper et al. .................... 326/21 |
| 5,585,740 | A | * | 12/1996 | Tipon ............................... 326/26 |
| 7,242,630 | B2 | | 7/2007 | Dwivedi et al. |
| 7,545,177 | B1 | | 6/2009 | Kao et al. |
| 7,633,787 | B2 | | 12/2009 | Gupta et al. |
| 7,646,653 | B2 | | 1/2010 | Choi et al. |
| 7,813,161 | B2 | | 10/2010 | Luthra |
| 2003/0218478 | A1 | | 11/2003 | Sani et al. |

(Continued)

*Primary Examiner* — Vanthu Nguyen
*Assistant Examiner* — Khamdan Alrobaie
(74) *Attorney, Agent, or Firm* — Dorsey & Whitney LLP

(57) ABSTRACT

Apparatus and methods for driving a signal are disclosed. An example apparatus includes a pre-driver circuit and a driver circuit. The pre-driver circuit includes a step-down transistor and the driver circuit includes a pull-down transistor configured to be coupled to a reference voltage. In a first mode, the step-down transistor is configured to reduce a voltage provided to the pull-down transistor to less than a supply voltage, and in a second mode, the step-down transistor configured to provide the voltage of the supply voltage to the pull-down transistor. The pre-driver circuit of the example signal driver circuit may further include a step-up transistor configured to increase a voltage provided to a pull-up transistor of the driver circuit to greater than the reference voltage, and in the second mode, the step-up transistor configured to provide the voltage of the reference voltage to the pull-up transistor.

20 Claims, 11 Drawing Sheets

(56) References Cited

U.S. PATENT DOCUMENTS

2007/0070783 A1* 3/2007 Lee .......................... 365/230.06
2008/0054973 A1 3/2008 Chan et al.
2008/0080296 A1 4/2008 Lee et al.
2009/0059689 A1* 3/2009 Do et al. .................. 365/189.17
2010/0061167 A1* 3/2010 Kim et al. ..................... 365/194
2010/0164544 A1* 7/2010 Song ............................... 326/80
2012/0287732 A1 11/2012 Kim et al.

* cited by examiner

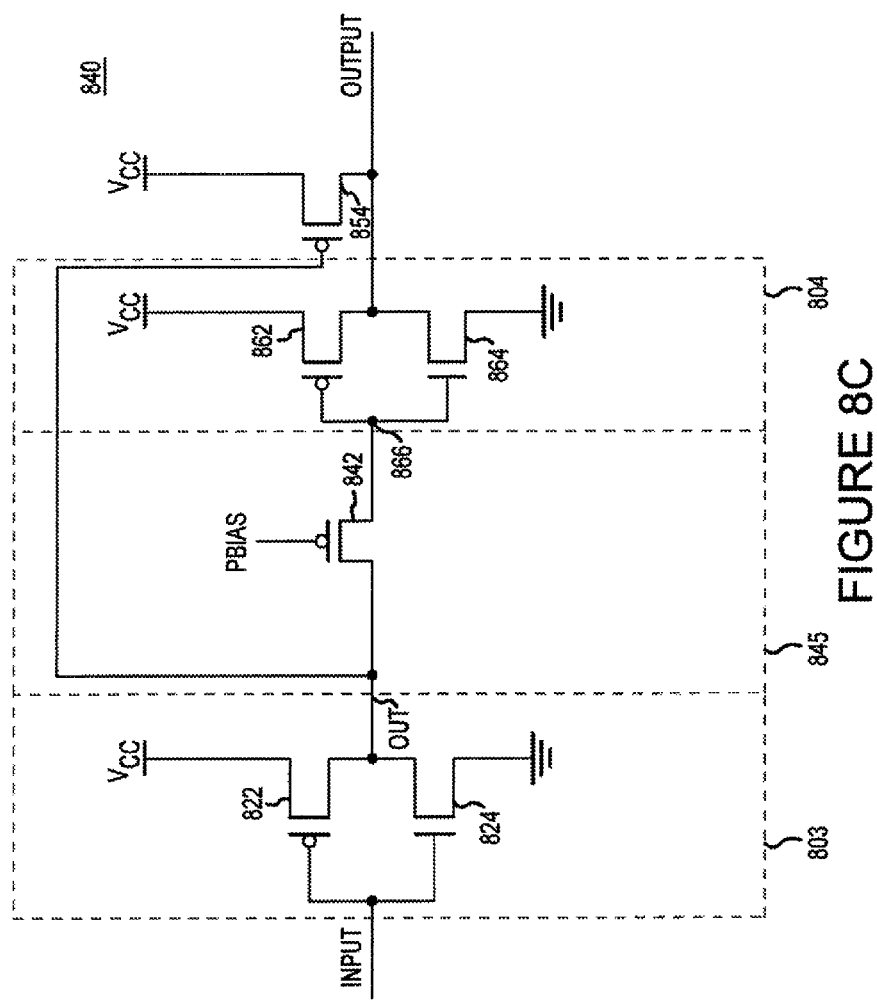

APPARATUS AND METHODS OF DRIVING SIGNAL FOR REDUCING THE LEAKAGE CURRENT

CROSS-REFERENCE TO RELATED APPLICATION

This application is a divisional of pending U.S. patent application Ser. No. 13/106,321, filed on May 12, 2011. This application is incorporated by reference herein in its entirety and for all purposes.

TECHNICAL FIELD

Embodiments of the invention relate generally to driver circuits, and more specifically in one or more of the illustrated embodiments, to signal driver circuits having reduced gate leakage current.

BACKGROUND OF THE INVENTION

The development of complementary metal-oxide semiconductor (CMOS) integrated circuits is notable for aggressive scaling of device dimensions and threshold voltage. Gate oxide thickness is also scaled to increase channel conductivity and performance when a CMOS field effect transistor (FET) is in active mode (i.e., switching output). However, at very small thickness levels, electrons can tunnel through the thin gate oxide when the FET is in active standby mode (i.e., static output). The resulting gate leakage current (Iot) from the gate to the body (also known as bulk or substrate) as gate oxide thicknesses are increasingly scaled contributes to overall integrated circuit power consumption.

In some driver circuits, the output is held low by coupling the output to ground (GND) through an activated pull-down FET or held high by coupling the output to a supply voltage ($V_{CC}$) through an activated pull-up FET. The pull-down FET is typically activated by providing $V_{CC}$ to a gate of the pull-down FET and the pull-up FET is typically activated by providing GND to a gate of the pull-up FET. The gate voltage may typically be $V_{CC}$ or GND, and results in gate leakage current ($I_{GB}$). Moreover, a pre-driver circuit may be used to drive the gates of the driver circuits. Transistors of the pre-driver circuit may also have gate leakage current ($I_{GB}$) contributing further to overall integrated circuit power consumption.

An approach that has been taken to reduce $I_{GB}$ in the transistors of the driver circuit is to use thicker oxide transistors which are more resistant to gate bias induced $I_{GB}$. A disadvantage of this approach, however, is that the transistors having thicker gate oxides may be less responsive during switching of the output signal. That is, the speed at which the thicker oxide transistors respond to input signals is comparatively slower than thinner gate oxide transistors, which in systems where high-speed switching is desirable may be unacceptable.

Accordingly, it is desirable for alternative circuits and methods for reducing $I_{GB}$ in driver circuits, which in turn, may reduce power consumption.

BRIEF DESCRIPTION OF THE DRAWINGS

FIGS. 8B and 8C are simplified schematic diagrams illustrating signal driver circuits according to other embodiments of the present invention.

DETAILED DESCRIPTION

One or more embodiments of the invention are directed to reducing integrated circuit power consumption by reducing gate leakage current (IGB) in various transistors of the circuitry. In some embodiments, the IGB is reduced by changing the voltage provided (e.g., applied) to gates of pull-down and/or pull-up field effect transistors (FETs) of a driver circuit. The voltage applied to the gates of the driver circuit FETs may be changed by stepping down or stepping up the gate applied voltage relative to a supply voltage or reference voltage (e.g., ground), respectively. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
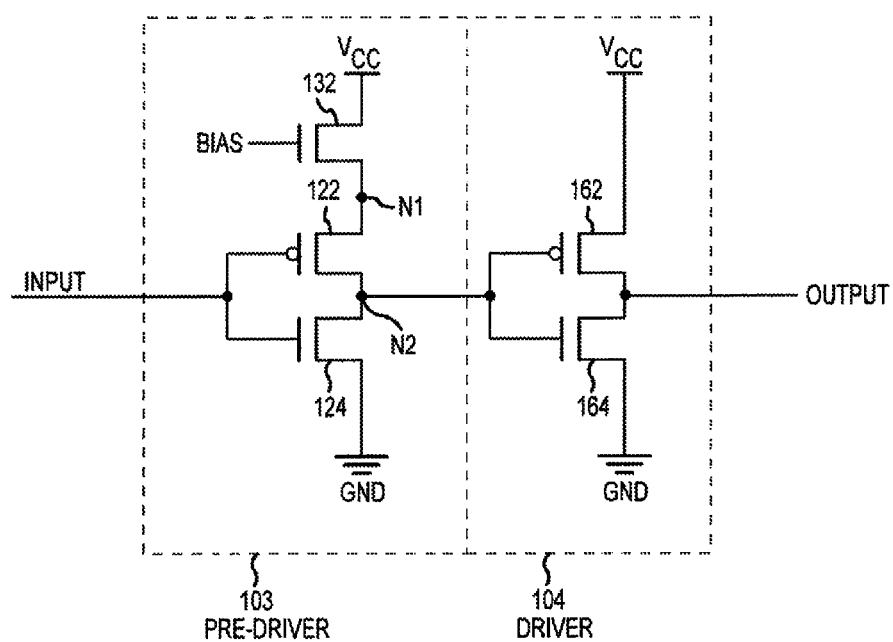
FIG. 1 is a simplified schematic diagram illustrating a signal driver circuit according to an embodiment of the present invention.

FIG. 1 illustrates a signal driver circuit 100 according to embodiments of the present invention. The signal driver circuit 100 may be considered an apparatus or included in an apparatus. Generally, the term apparatus may refer to any one of a number of structures, such as circuitry, a device or devices (e.g., memory devices that include signal driver circuits), or a system or systems (e.g., systems including memory devices). The signal driver circuit 100 includes a pre-driver circuit 103 and a driver circuit 104. The signal driver circuit 100 is configured to provide an output signal OUTPUT responsive to an input signal INPUT. The pre-driver circuit 103 and the driver circuit 104 may include transistors. In some embodiments, the transistors are field effect transistors (FETs), for example, p-channel FETs (pFETs) and n-channel FETs (nFETs). In some embodiments, the transistors are metal oxide semiconductor field effect transistors (MOSFETs). The driver circuit 104 may include thin-dielectric (e.g. oxide) pull-up transistor 162 and pull-down transistor 164. The pre-driver circuit 103 may include a step-down transistor 132 coupled between supply voltage VCC and an output N2 of pre-driver circuit 103. In some embodiments, step-down transistor 132 is coupled to a source of pull-up transistor 122 at node N1 and to supply voltage VCC. The pull-up transistor 122 is coupled to the output N2, to which a pull-down transistor 124 is also coupled. Step-down transistor 132 may be a non-thin-dielectric FET to limit gate leakage current (IGB). The step-down transistor's 132 performance may not be handicapped by a thick gate dielectric because, as described in more detail below, transistor 132 may have sufficient performance over a narrow switching range.

In active standby mode (i.e., the OUTPUT signal is static), a gate of step-down transistor 132 is biased by a bias voltage BIAS to reduce the voltage applied to the output N2 of pre-driver circuit 103, and consequently, to the input of driver circuit 104. For example, a BIAS voltage having a voltage magnitude of VCC will step down the voltage applied to the source of the pull-up transistor 122 by a threshold voltage VT of step-down transistor 132 (i.e., VCC−VT). Under this condition, the output N2 may be driven to a maximum voltage of VCC−VT through transistor 122 during active standby mode. The reduction in the voltage applied to the output N2 in turn reduces the voltage applied to the input of driver circuit 104. The lower voltage at the input of driver circuit 104 may reduce the IGB in pull-down transistor 164 of driver circuit 104.

While the signal driver circuit 100 is in active mode (i.e., the OUTPUT signal may be switching), stepping down the maximum voltage applied to the output N2 may not be desirable for performance reasons. It may instead be desirable to provide full-voltage (i.e., VCC or ground) to the output N2 of the pre-driver circuit in order to drive the gates of the pull-up and pull-down transistors 162, 164. For example, in some embodiments, during active mode the step-down transistor 132 may be sufficiently biased such that substantially the full-voltage of VCC may be provided through the pull-up transistor 122 to output N2. As a result, the full-voltage of VCC may be provided to the gate of pull-down transistor 164 of driver circuit 104. Providing the full-voltage to the transistor 164 may enable it to switch between a non-conductive to a conductive state relatively quickly. A BIAS voltage of at least the supply voltage VCC plus the threshold voltage of step-down transistor 132 (i.e., VCC+VT) may be provided to the gate of the step-down transistor 132 to provide substantially the full voltage of VCC at the output N2 of pre-driver circuit 103, and consequently, to the gate N2 of pull-down transistor 164 of driver circuit 104.

In some embodiments of the present invention, the step-down transistor 132 may be coupled to the sources of pull-up transistors 122 of a plurality of pre-driver circuits 103 (not shown). Such a configuration provides a step-down voltage to a plurality of pre-driver circuits 103 using one step-down transistor 132.

Figure 2:
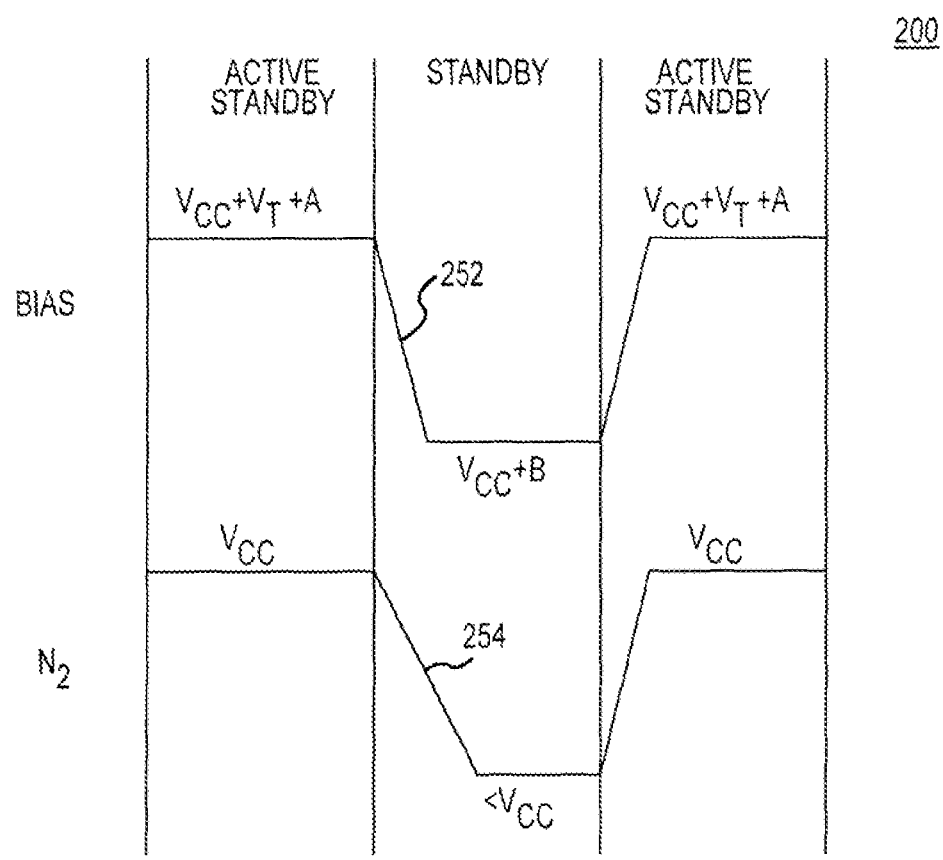
FIG. 2 is a simplified timing diagram illustrating various voltages during operation of the signal driver circuit of FIG. 1 according to an embodiment of the invention.

FIG. 2 is a simplified timing diagram 200 illustrating various voltages during operation of the signal driver circuit 100 assuming a low logic level INPUT signal. In particular, the BIAS voltage provided to the gate of step-down transistor 132 and the output N2 of the pre-driver circuit 103 during active standby mode and active mode are illustrated. During active standby mode, the voltage applied to gate of step-down transistor 132 may be the sum of VCC and a voltage B (i.e., VCC+B). When the voltage B is less than a threshold voltage VT of the step-down transistor 132, the maximum voltage available to be provided to node N1 is less than the supply voltage VCC, as illustrated in FIG. 2. At the output N2 of the pre-driver circuit 103, the voltage will also be less than VCC, with the actual voltage depending at least in part upon the value of voltage B.

During active mode the voltage provided to the gate of step-down transistor 132 is at least the sum of VCC, the threshold voltage VT of step-down transistor 132, and voltage A (i.e., VCC+VT+A). As a result, the full voltage of VCC may be provided to node N1. Moreover, the voltage of the supply voltage VCC may be provided to the output N2 of the pre-driver circuit 103 as illustrated in FIG. 2. In the transition from active mode to active standby mode, the output N2 of the pre-driver circuit 103 may take a long time to discharge from VCC to a voltage less than VCC, longer than the change in the BIAS signal from (VCC+VT+A) to (VCC+B), illustrated in FIG. 2 as a slower fall time 254 in comparison to a fall time 252 for the BIAS voltage.

Figure 3:
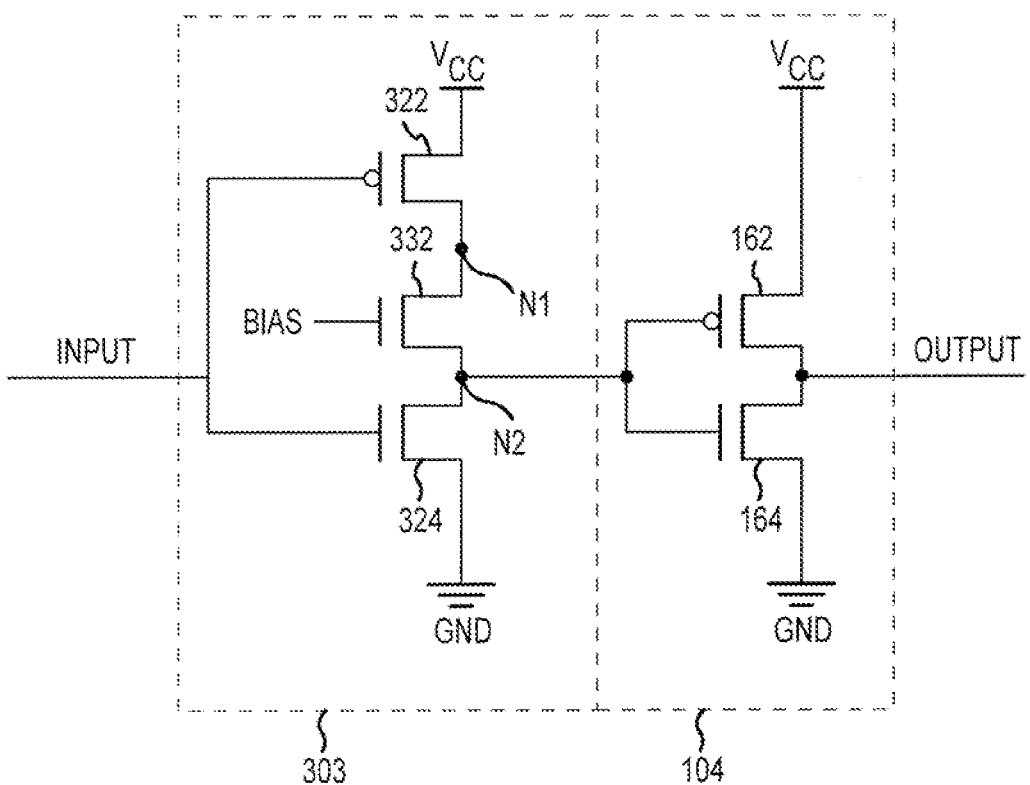
FIG. 3 is a simplified schematic diagram illustrating a signal driver circuit according to an embodiment of the present invention.

FIG. 3 illustrates a signal driver circuit 300 according to an embodiment of the present invention. For clarity, the same reference numerals are used to designate elements analogous to those described above in connection with FIG. 1. For brevity, the description of FIG. 1 is not repeated with respect to FIG. 3. Signal driver circuit 300 is similar to the signal driver circuit 100 of FIG. 1, except step-down transistor 332 may be coupled between a drain of pull-up transistor 322 at node N1 and the output N2 of pre-driver circuit 103. A pull-down transistor 324 is coupled to the output N2 and a reference voltage, for example, ground GND as illustrated in FIG. 1. In contrast to the step-down transistor 132 shown in FIG. 1, the step-down transistor 332 may step-down the voltage provided by pull-up transistor 322 to the output N2 rather than stepping-down the supply voltage VCC provided to a source of the pull-up transistor 122.

In operation, the step-down transistor 332 is biased similarly to step-down transistor 132 (FIG. 1) as previously described with reference to FIG. 2 to reduce the voltage at the output N2 of pre-driver circuit 303 when the signal driver circuit 300 is in active standby mode. The reduction in the voltage at the output N2 of pre-driver circuit 303 may reduce the voltage applied to the input (i.e., gates of transistors 162, 164) of driver circuit 104 during active standby mode. As a result, the IGB of pull-down transistor 164 of driver circuit 104 may be reduced. In active mode, step-down transistor 332 may provide the full voltage of VCC to the output N2 of pre-driver circuit 303 by biasing the step-down transistor 332 similarly as the step-down transistor 132 (FIG. 1) as shown in FIG. 2.

Figure 4:
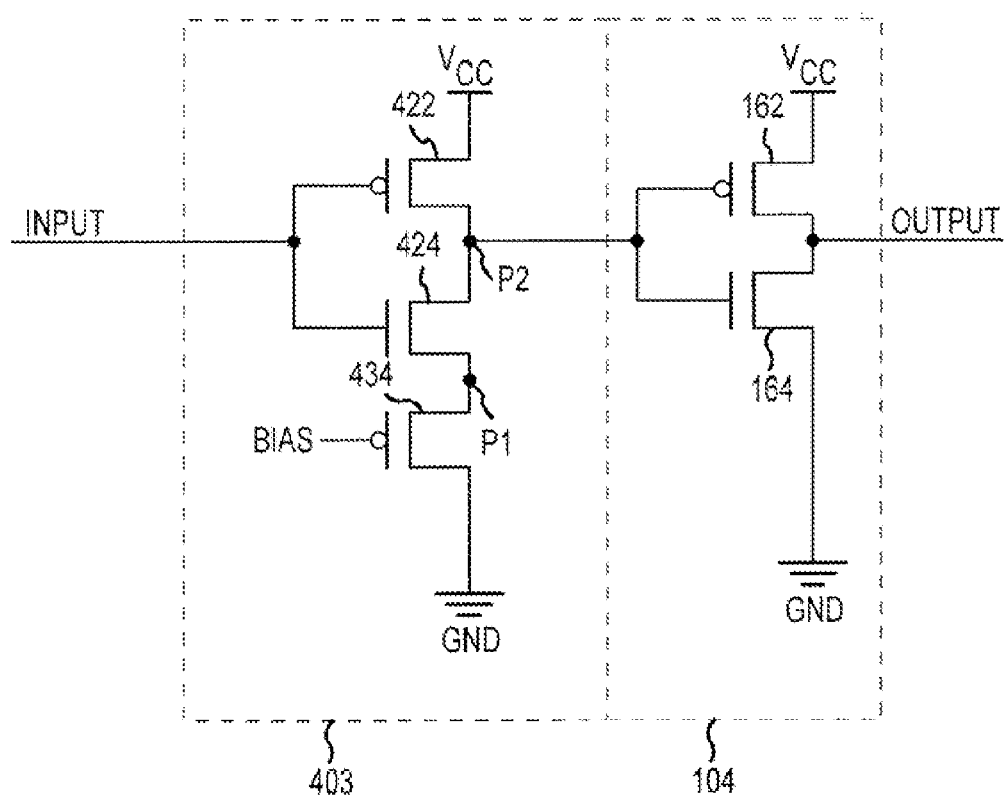
FIG. 4 is a simplified schematic diagram illustrating a signal driver circuit according to an embodiment of the present invention.

FIG. 4 illustrates a signal driver circuit 400 according to an embodiment of the present invention. For clarity, the same reference numerals are used to designate elements analogous to those described above in connection with FIG. 1. For brevity, the description of FIG. 1 is not repeated with respect to FIG. 4.

Pre-driver circuit 403 includes a step-up transistor 434 coupled between an output P2 of pre-driver circuit 403 and a reference voltage, for example, shown in FIG. 4 as ground GND. A bias voltage BIAS may be used to step-up a voltage provided to the output P2 during active standby mode. The pre-driver circuit 403 further includes pull-up and pull-down transistors 422, 424 coupled to the output P2. Step-up transistor 434 may be a non-thin-dielectric FET to limit IGB. Step-up transistor's 434 performance may not be handicapped by the thick gate dielectric because, as described in more detail below, the switching range of step-up transistor 434 may be sufficiently narrow so that performance over the narrow range is acceptable.

Figure 5:
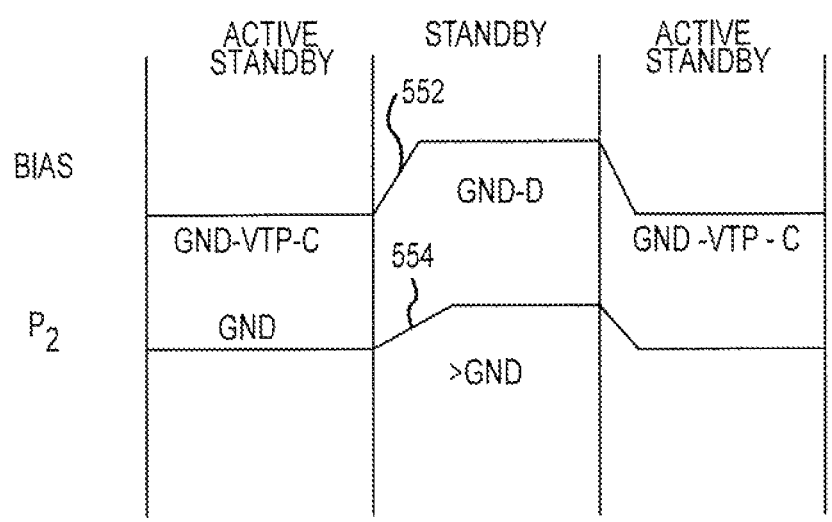
FIG. 5 is a simplified timing diagram illustrating various voltages during operation of the signal driver circuit of FIG. 4 according to an embodiment of the invention.

Operation of the signal driver circuit 400 will be described with reference to the timing diagram of FIG. 5. FIG. 5 illustrates various voltages during operation of the signal driver circuit 400 assuming a high logic level INPUT signal. In particular, the BIAS voltage provided to the step-up transistor 434 and the voltage at node P2 is illustrated in FIG. 5. In active standby mode, step-up transistor 434 raises the voltage provided to the gate of pull-up transistor 162 of driver circuit 104. Increasing the voltage provided to the gate of the pull-up transistor 162 of driver circuit 104 may reduce IGB in pull-up transistor 162. Instead of providing ground GND to the gate of the pull-up transistor 162 during active standby, the step-up transistor 434 is biased to provide a voltage greater than ground GND, as illustrated in FIG. 5. For example, the step-up transistor 434 may be biased with a BIAS voltage substantially equal to ground to increase the voltage provided to pull-up transistor 162 by a voltage approximately equal to a threshold voltage VT of step-up transistor 434. More generally, a voltage greater than a difference between ground GND and a voltage D (i.e., GND–D) may be applied to the gate of the step-up transistor 434 to step-up the voltage provided to the pull-up transistor 162 during active standby mode. Where D is less than the threshold voltage VT of the step-up transistor 434 a voltage greater than GND is provided to the output N2 of pre-driver circuit 403.

In active mode, ground GND is provided to the input (i.e., gates of transistors 162, 164) of driver circuit 404. For example, ground GND minus a threshold voltage VT of the step-up transistor 434 (i.e., GND–VT) may be provided as the BIAS voltage to the step-up transistor 434, so that ground GND may be provided to the output of pre-driver circuit 403. More generally, ground GND minus the threshold voltage VT of the step-up transistor 434 minus C (i.e., GND–VT–C) may be provided to the step-up transistor 434 to provide ground GND to the output of pre-driver circuit 403. For example, when the voltage C is greater than zero GND is provided to the output N2, as illustrated in FIG. 5. In the transition from active mode to active standby mode, the output P2 of the pre-driver circuit 403 may take a longer time to charge from GND to a voltage greater than GND than the change in the BIAS signal from (GND–VT–C) to (GND–D), illustrated in FIG. 2 as a slower rise time 554 in comparison to a rise time 552 for the BIAS voltage.

In some embodiments of the present invention the step-up transistor 434 maybe coupled to the sources of pull-down transistors 424 of a plurality of pre-driver circuits 403 (not shown). Such a configuration provides a step-up voltage to a plurality of pre-driver circuits 403 using one step-up transistor 434.

Figure 6:
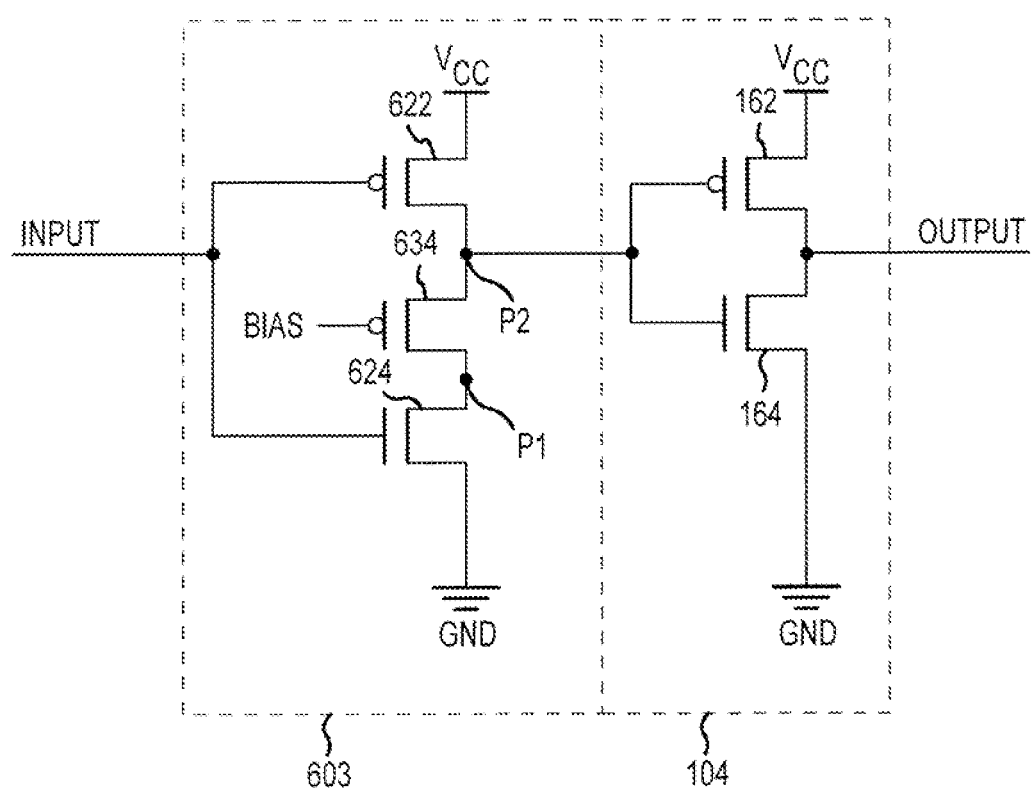
FIG. 6 is a simplified schematic diagram illustrating a signal driver circuit according to an embodiment of the present invention.

FIG. 6 illustrates a signal driver circuit 600 according to an embodiment of the present invention. For clarity, the same reference numerals are used to designate elements analogous to those described above in connection with FIG. 1. For brevity, the description of FIG. 1 is not repeated with respect to FIG. 6. Signal driver circuit 600 is similar to the signal driver circuit 400 of FIG. 4, except a step-up transistor 634 is coupled to an output P2 and a drain of pull-down transistor 624 of pre-driver circuit 603 at node P1. A pull-up transistor 622 is further coupled to a supply voltage VCC and the output P2. In contrast to the step-up transistor 434 shown in FIG. 4, the step-up transistor 634 is not coupled between the pull-down transistor 624 and ground GND but is coupled between the output P2 and the drain of the pull-down transistor 624.

In operation, the step-up transistor 634 may be biased similarly to the step-up transistor 434 of FIG. 4 as shown in FIG. 5. For example, during active standby mode the voltage provided to the output P2 of pre-driver circuit 603 may be greater than ground GND less the threshold voltage VT of the step-up transistor 634. The resulting increase in the voltage provided to the output P2 of pre-driver circuit 603 may in turn increase the voltage provided to the input (i.e., gates of the transistors 162, 164) of driver circuit 104. As a result, the IGB of pull-up transistor 162 of driver circuit 104 may be reduced. For example, the output P2 of pre-driver circuit 603 is stepped-up from GND when the gate of the step-up transistor 634 is biased by a BIAS voltage of GND to provide a voltage substantially equal to the threshold voltage VT of the step-up transistor 434 to the output P2 of pre-driver circuit 603. In active mode, the step-up transistor 634 may also be biased similarly to the step-up transistor 434 of FIG. 4 and as shown in FIG. 5 to provide ground GND to the output P2 of pre-driver circuit 603. That is, during active mode, for example, the BIAS voltage may be less than (GNiD–VT) thereby providing GND to the output P2.

Figure 7:
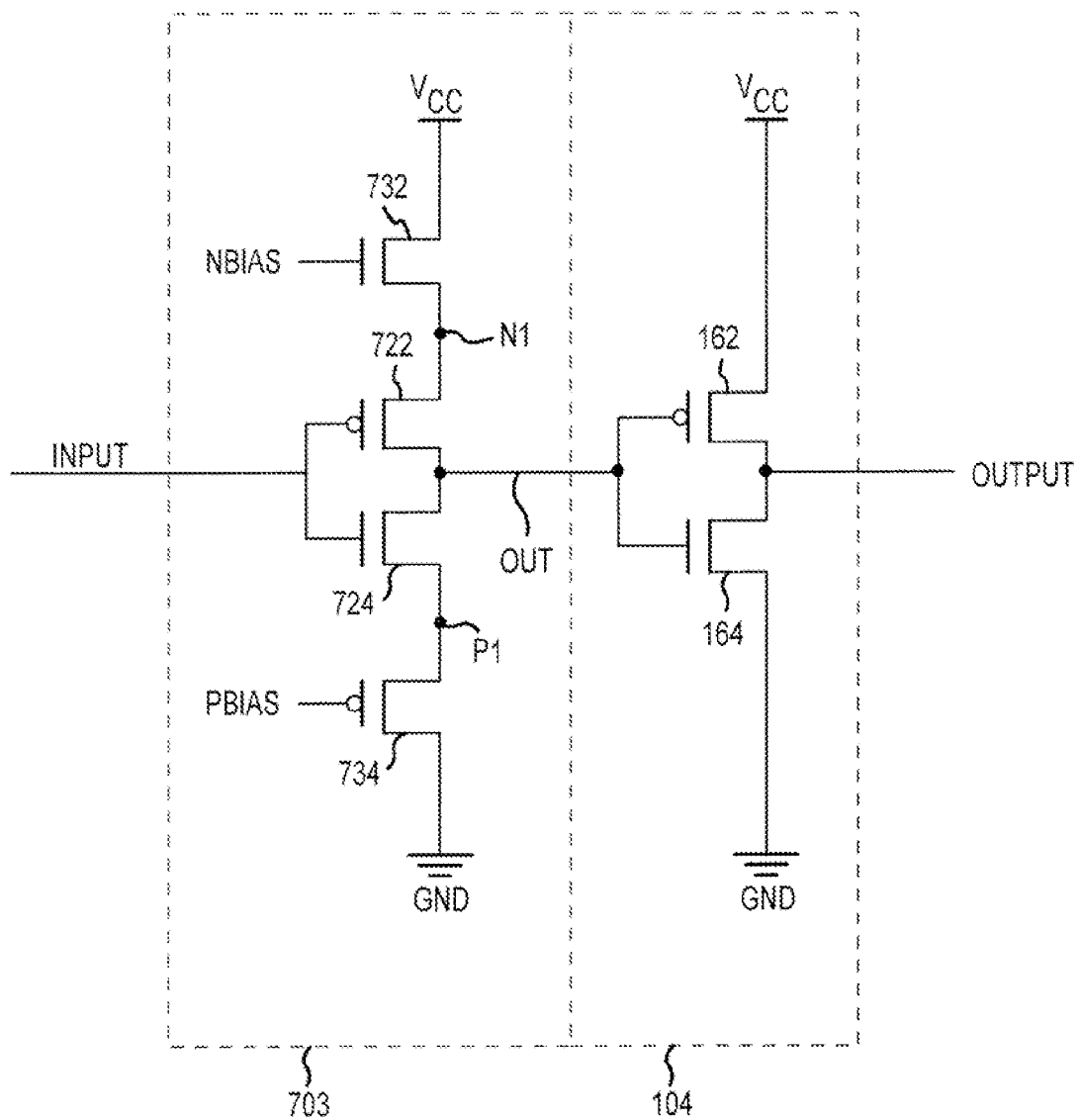
FIG. 7 is a simplified schematic diagram illustrating a signal driver circuit according to an embodiment of the present invention.

FIG. 7 illustrates a signal driver circuit 700 according to an embodiment of the present invention. Signal driver circuit 700 includes features of signal driver circuit 100 of FIG. 1 and the signal driver circuit 400 of FIG. 4. For clarity, the same reference numerals are used to designate elements analogous to those described above in connection with FIGS. 1 and 4. For brevity, the descriptions of FIGS. 1 and 4 are not repeated with respect to FIG. 7. Pre-driver circuit 703 includes a step-down transistor 732 coupled to a supply voltage VCC and an output OUT of pre-driver circuit 703. The pre-driver circuit further includes a step-up transistor 734 coupled to the output OUT of the pre-driver circuit 703 and a reference voltage, for example, ground GND as illustrated in FIG. 7. The pre-driver 703 includes pull-up and pull-down transistors 722, 724 coupled to the output OUT. A step-down bias voltage NBIAS provided to the step-down transistor 732 may be used to bias the step-down transistor 732 in a similar manner as the step-down transistor 132 of FIG. 1 as shown in FIG. 2 during, for example, active standby and active modes. Moreover, a step-up bias voltage PBIAS provided to the step-up transistor 734 may be used to bias the step-up transistor 734 in a similar manner as the step-up transistor 434 of FIG. 4 as shown in FIG. 5, for example, during active standby and active modes.

In some embodiments of the present invention, the step-down transistor 732 may be coupled to the sources of pull-up transistors 722 of a plurality of pre-driver circuits 703 (not shown). Such a configuration provides a step-down voltage to a plurality of pre-driver circuits 703 using one step-down transistor 732. Similarly, in some embodiments of the present invention the step-up transistor 734 maybe coupled to the sources of pull-down transistors 724 of a plurality of pre-driver circuits 703 (not shown). Such a configuration provides a step-up voltage to a plurality of pre-driver circuits 703 using one step-up transistor 734.

The signal driver circuit 700 may be operated in a manner similar to the operation of signal driver circuit 100 (FIG. 1) and signal driver 400 (FIG. 4) as previously described. For example, during active standby mode the step-down transistor 732 may be biased by NBIAS to reduce the voltage provided to node N1 to less than VCC, which in turn decreases the voltage provided to the output OUT of pre-driver circuit 703. The reduced voltage at the output OUT of pre-driver circuit 703 may decrease the IGB in the pull-down transistor 164 of the driver circuit 104 when the OUTPUT signal of the driver circuit 104 is a low logic level. The step-up transistor 734 may be biased by PBIAS to increase the voltage provided to node P1 to above ground GND during active standby mode, which in turn increases the voltage provided to the output OUT of the pre-driver circuit 703. The increased voltage provided to the output OUT of pre-driver circuit 703 may decrease the IGB in pull-up transistor 162 of the driver circuit 104 when the OUTPUT signal of the driver circuit 104 is a high logic level.

Figure 8A:
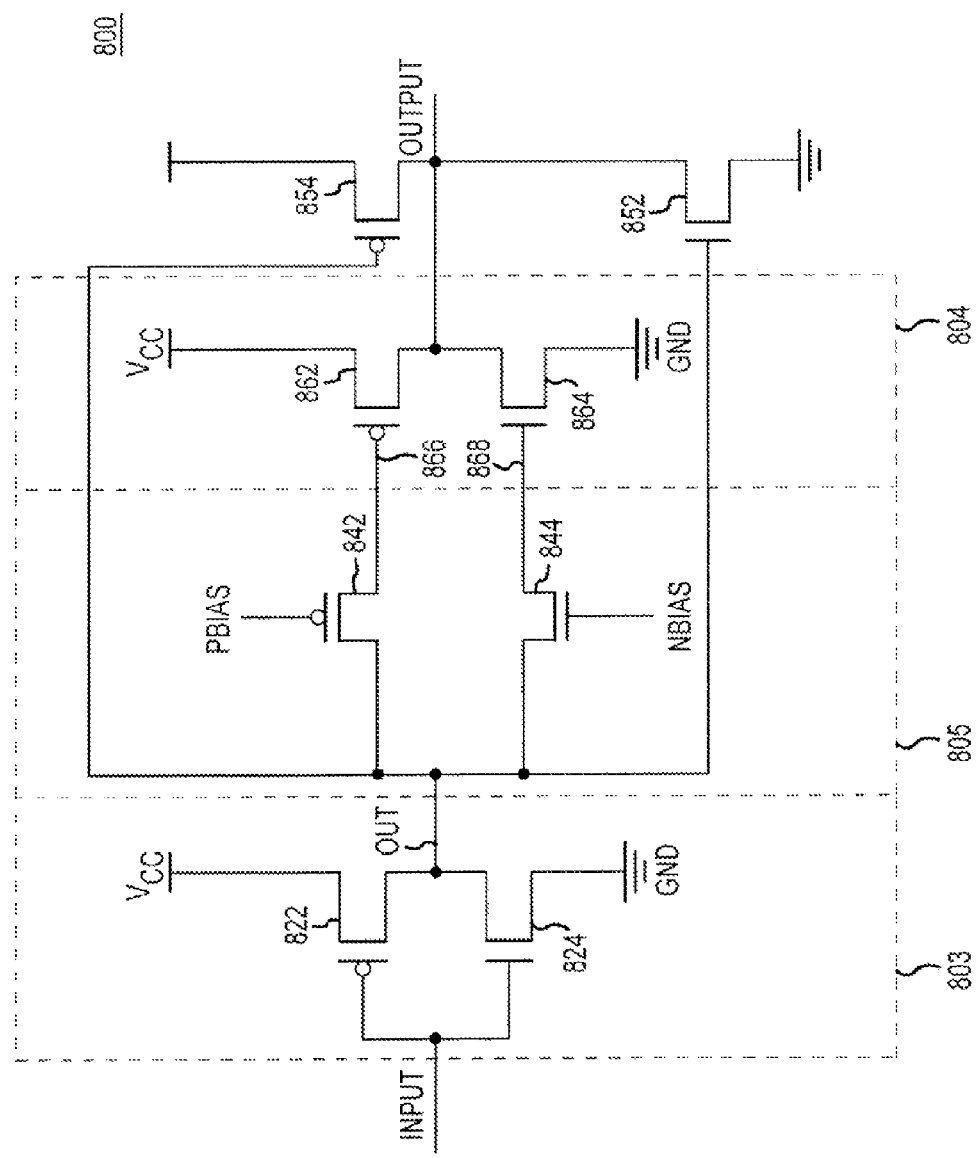
FIG. 8A is a simplified schematic diagram illustrating a signal driver circuit according to an embodiment of the present invention.

FIG. 8A illustrates a signal driver circuit 800 according to an embodiment of the present invention. Signal driver circuit 800 includes a pre-driver circuit 803 and a driver circuit 804. The pre-driver circuit 803 includes a pull-up transistor 822 and a pull-down transistor 824 coupled to a pre-driver output OUT. The pre-driver circuit 803 is configured to provide an output signal responsive to an input INPUT. The driver circuit 804 includes a pull-up transistor 862 and a pull-down transistor 864 coupled between a supply voltage VCC and a reference voltage, for example, ground GND as illustrated in FIG. 8A. The driver circuit 804 is configured to provide an output signal OUTPUT responsive to the output OUT of the pre-driver circuit 803. A keeper transistor 852 may be coupled to the output of the driver circuit 804 and have a gate coupled to the output OUT of the pre-driver circuit 803. The keeper transistor 852 may be used to assist in holding the output of the driver circuit 804 to ground during active standby mode. A keeper transistor 854 may be coupled to the output of the driver circuit 804 as well. The keeper transistor 854 may be used to assist in holding the output of the driver circuit 804 to VCC during active standby mode.

The signal driver circuit 800 further includes a voltage step circuit 805 coupled to the output OUT of the pre-driver circuit 803 and to an input of the driver circuit 804. The voltage step-circuit 803 is illustrated in the embodiment of FIG. 8A as including a step-down transistor 844 and a step-up transistor 842. As will be described below, however, other embodiments of the voltage step circuit 805 may include one of the transistors 842, 844 but not the other. That is, other embodiments of the voltage step circuit 805 may include the step-down transistor 842 or the step-up transistor 844.

The step-up transistor 842 may be biased by a voltage PBIAS to step-up the gate voltage provided to the pull-up transistor 862 during active standby mode from ground GND, and to further provide ground GND to the pull-up transistor 862 during active mode. The step-up transistor 842 may be implemented by a pFET, as illustrated in FIG. 8A, and may be a non-thin-dielectric transistor. The step-down transistor 844 may be biased by a voltage NBIAS to step-down the gate voltage provided to the pull-down transistor 864 during active standby mode from the supply voltage VCC, and to further provide the full voltage of the supply voltage VCC to the pull-down transistor 864 during active mode. The step-down transistor 844 may be implemented by an nFET, as illustrated in FIG. 8A, and may be a non-thin-dielectric transistor.

In operation, the signal driver circuit 800 may be operated in an active standby mode where the OUTPUT signal provided by the driver circuit 804 is generally static, and operated in an active mode wherein the OUTPUT signal provided by the driver circuit 804 may switch. In an active standby mode, the NBIAS voltage provided to the gate of the step-down transistor 844 may be used to step down the voltage provided to gate 868 of the pull-down transistor 864 of driver circuit 804. For example, providing an NBIAS voltage substantially equal to VCC during active standby mode reduces the voltage provided to the gate 868 by approximately the threshold voltage VTn of the step-down transistor 844. Generally, an NBIAS voltage less than (VCC+VTn) may be used in some embodiments to step-down the voltage provided to the gate 868 during active standby mode. The reduced voltage provided to gate 868 may decrease the IGB in pull-down transistor 864 during active standby mode when the OUTPUT signal of driver circuit 804 is a low logic level.

Similarly, in an active standby mode the PBIAS voltage provided to the gate of the step-up transistor 842 may be used to step-up the voltage provided to gate 866 of the pull-up transistor 862 of driver circuit 804. For example, providing a PBIAS voltage substantially equal to ground GND during active standby mode increases the voltage provided to the gate 866 by approximately the threshold voltage VTp of the step-up transistor 842. Generally, voltages greater than (GND−VTp) may be used in some embodiments to step-up the voltage provided to the gate 866 during active standby mode. The increased voltage provided to gate 866 may decrease the IGB in pull-up transistor 862 during active standby mode when the OUTPUT signal of driver circuit 104 is a high logic level.

The pull-down transistor 864 may weakly hold the output of driver circuit 104 at ground GND. The keeper transistor 852 may be included to hold the output OUTPUT of driver circuit 104 at ground GND during the active standby mode when the supply voltage VCC is provided to the output OUT of the pre-driver circuit 803. Similarly, the pull-up transistor 862 may weakly hold the output of driver circuit 104 at VCC. The keeper transistor 854 may be included to hold the output OUTPUT of driver circuit 104 at VCC during the active standby mode when GND is provided to the output OUT of the pre-driver circuit 803. In some embodiments, the keeper transistor 852 and the keeper transistor 854 are non-thin-dielectric FETs to reduce IGB in the keeper transistors 852 and 854 during active standby mode. In some embodiments, keeper transistors 852 and 854 are thick dielectric FETs.

In active mode, the NBIAS voltage provided to the gate of the step-down transistor 844 allows the full voltage of the supply voltage VCC to be provided to gate 868 of the pull-down transistor 864 of driver circuit 804. For example, providing an NBIAS voltage during active mode that is at least substantially equal to the sum of VCC and the threshold voltage VTn of the step-down transistor 844 (i.e., VCC+VTn) fully provides VCC to the gate 868. Voltages greater than the sum of VCC and VTn may be used for NBIAS in some embodiments to sufficiently bias the step-down transistor 844 to provide the full voltage of VCC during active mode.

Similarly, the PBIAS voltage provided to the gate of the step-up transistor 842 during active mode allows the gate 866 to be coupled to ground GND. For example, providing a PBIAS voltage during active mode that is at least less than GND minus the threshold voltage VTp of the step-up transistor 842 fully provides GND to the gate 866. Voltages less than (GND−VTp) may be used for PBIAS in some embodiments to sufficiently bias the step-up transistor 842 to provide GND to the gate 866 during active mode.

Figure 8B:
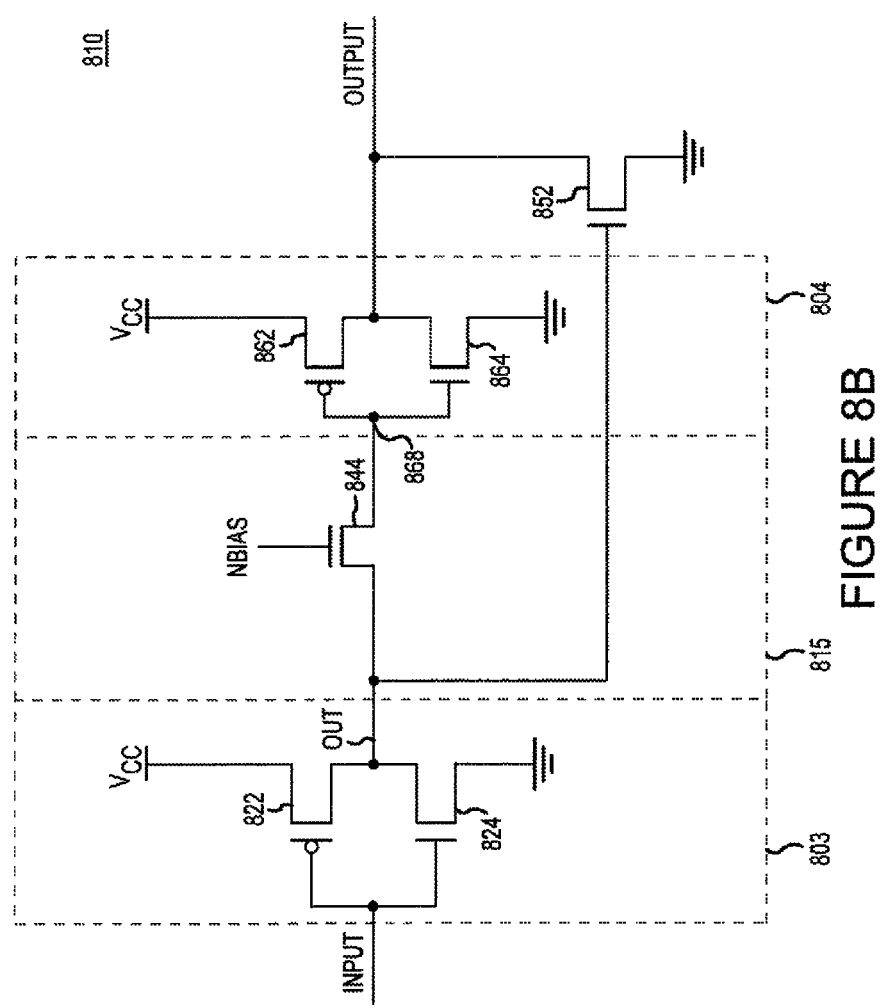

FIGS. 8B and 8C illustrate signal driver circuits 810 and 840 according to other embodiments of the present invention. The signal driver circuits 810 and 840 include elements previously described with reference to the signal driver circuit 800 of FIG. 8A. Reference numbers for previously described elements are also used in FIGS. 8B and 8C. Signal driver circuits 810 and 840 include a pre-driver circuit 803 and a driver circuit 804, which are the same as previously described with reference to signal driver circuit 800.

The signal driver circuit 810 further includes a voltage step circuit 815 coupled to the output OUT of the pre-driver circuit 803 and to an input of the driver circuit 804. In contrast to the voltage step circuit 805 of the signal driver circuit 800, the voltage step-circuit 815 includes step-down transistor 844 but does not include step-up transistor 842. A keeper transistor 852 may be coupled to the output of the driver circuit 804 and have a gate coupled to the output OUT of the pre-driver circuit 803. The signal driver circuit 840 includes a voltage step circuit 845 coupled to the output OUT of the pre-driver circuit 803 and to an input of the driver circuit 804. The voltage step-circuit 845 includes step-up transistor 842 but does not include step-down transistor 844. A keeper transistor 854 may be coupled to the output of the driver circuit 804 and have a gate coupled to the output OUT of the pre-driver circuit 803.

The embodiments illustrated in FIGS. 8B and 8C may be desirable for changing a driving voltage provided to one of the transistors of the driver circuit 804 but not the other transistor. Operation of the voltage step circuits 815 and 845 is similar to that previously described with reference to the voltage step circuit 805 of FIG. 8A, and will not be repeated in the interest of brevity.

Figure 9:
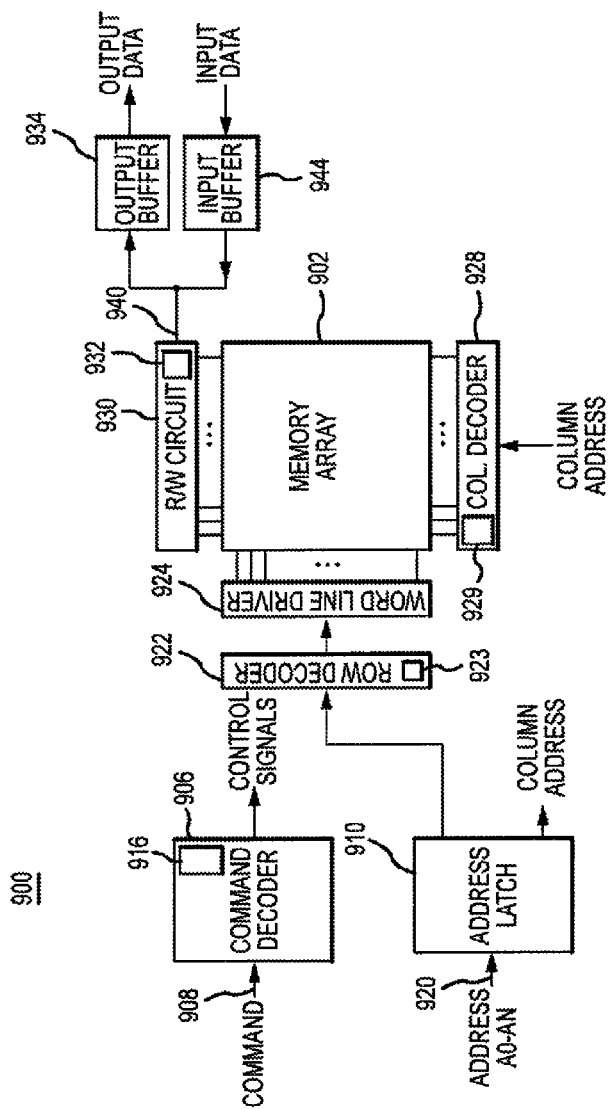
FIG. 9 is a simplified block diagram illustrating a memory having a signal driver circuit according to an embodiment of the present invention.

FIG. 9 illustrates an apparatus such as a memory 900 having a signal driver circuit according to an embodiment of the present invention. The memory 900 includes an array 902 of memory cells, which may be, for example, DRAM memory cells, SRAM memory cells, flash memory cells, or some other type of memory cells. The memory 900 includes a command decoder 906 that receives memory commands through a command bus 908 and provides corresponding control signals within the memory 900 to carry out various memory operations. Row and column address signals are provided to the memory 900 through an address bus 920 and provided to an address latch 910. The address latch 910 provides a separate column address and a separate row address.

The row and column addresses are provided by the address latch 910 to a row address decoder 922 and a column address decoder 928, respectively. The column address decoder 928 selects bit lines extending through the array 902 corresponding to respective column addresses. The row address decoder 922 is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to a data output buffer 934 via an input-output data bus 940. Write data are applied to the memory array 902 through a data input buffer 944 and the memory array read/write circuitry 930. The command decoder 906 responds to memory commands applied to the command bus 908 to perform various operations on the memory array 902. In particular, the command decoder 906 is used to generate internal control signals to read data from and write data to the memory array 902.

A signal driver circuit according to an embodiment of the invention is included in the memory 900. In some embodiments of the memory 900, signal driver circuits according to an embodiment of the invention are configured to drive internal or on-chip signals from one internal component to another, for example, signal driver circuits 916 driving internal control signals from the command decoder 906 to other internal components of the memory 900. Other examples include signal driver circuits 923, 929 driving internal address signals from the address decoders 922, 928, and signal driver circuits 932 driving internal data signals over the input-output bus 940. Signal driver circuits may be utilized in other applications as well in other embodiments of the invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a pre-driver circuit configured to receive an input signal and provide a pre-driver output signal at a pre-driver output node responsive thereto;
    a driver circuit including a pull-up transistor configured to be coupled to a supply voltage and including a pull-down transistor configured to be coupled to a reference voltage, the driver circuit configured to provide a driver output signal at a driver output node responsive to the pre-driver output signal; and
    a voltage step circuit coupled to the pre-driver circuit and the driver circuit, the voltage step circuit including a step-down transistor coupled to the pre-driver output node and to a gate of the pull-down transistor, the step-down transistor configured to reduce a voltage provided to the gate of the pull-down transistor to less than a first logic level voltage of the output signal from the pre-driver circuit to reduce a leakage current of the pull-down transistor during a first mode, the step-down transistor further configured to provide the first logic level voltage of the output signal from the pre-driver circuit to the gate of the pull-down transistor during a second mode.

2. The apparatus of claim 1 wherein the step-down transistor has a threshold voltage and the step-down transistor is configured to reduce the voltage provided to the gate of the pull-down transistor during the first mode responsive to a gate bias of less than the sum of the first logic level voltage and the threshold voltage and further configured to provide the first logic level voltage to the gate of the pull-down transistor responsive to the gate bias being greater than or equal to the sum of the first logic level voltage and the threshold voltage.

3. The apparatus of claim 1 wherein the pull-down transistor comprises a thin-oxide transistor and the pull-down transistor has a thinner gate dielectric than the step-down transistor.

4. The apparatus of claim 1 wherein the voltage step circuit further includes a step-up transistor coupled to the pre-driver output node and to a gate of the pull-up transistor, the step-up transistor configured to increase a voltage provided to the gate of the pull-up transistor to greater than a second logic level voltage of the output signal from the pre-driver circuit to reduce a leakage current of the pull-up transistor during a first mode, the step-up transistor further configured to provide the second logic level voltage of the output signal from the pre-driver circuit to the gate of the pull-up transistor during a second mode.

5. The apparatus of claim 4 wherein the step-down transistor comprises a nFET and the step-up transistor comprises a pFET.

6. The apparatus of claim 5 wherein the pull-up transistor comprises a thin-oxide transistor and pull-up transistor has a thinner gate dielectric than the step-up transistor.

7. The apparatus of claim 4 wherein the step-up transistor has a threshold voltage and the step-up transistor is configured to increase the voltage provided to the gate of the pull-down transistor during the first mode responsive to a gate bias of greater than the second logic level voltage minus the threshold voltage and further configured to provide the second logic level voltage to the gate of the pull-up transistor responsive to the gate bias being less than or equal to the second logic level voltage minus the threshold voltage.

8. The apparatus of claim 1, further comprising a transistor coupled to the driver output node and the pre-driver output node, the transistor configured to couple the driver output node to the reference voltage responsive to the first logic level voltage during the first mode.

9. An apparatus, comprising:
a pre-driver circuit configured to receive an input signal and provide a pre-driver output signal at a pre-driver output node responsive thereto;
a driver circuit including a pull-up transistor configured to be coupled to a supply voltage and including a pull-down transistor configured to be coupled to a reference voltage, the driver circuit configured to provide a driver output signal at a driver output node responsive to the pre-driver output signal; and
a voltage step circuit coupled to the pre-driver circuit and the driver circuit, the voltage step circuit including a step-up transistor coupled to the pre-driver output node and to a gate of the pull-up transistor, the step-up transistor configured to increase a voltage provided to the gate of the pull-up transistor to more than a first logic level voltage of the output signal from the pre-driver circuit to reduce a leakage current of the pull-up transistor during a first mode, the step-up transistor further configured to provide the first logic level voltage of the output signal from the pre-driver circuit to the gate of the pull-up transistor during a second mode.

10. The apparatus of claim 9 wherein the pre-driver circuit comprises a first complementary FET inverter circuit and the driver circuit comprises a second complementary FET inverter circuit.

11. The apparatus of claim 9, further comprising a transistor coupled to the driver output node and the pre-driver output node, the transistor configured to couple the driver output node to the supply voltage responsive to the first logic level voltage during the first mode.

12. The apparatus of claim 9, further comprising:
a memory array;
read/write circuitry coupled to the memory array and configured to provide data from and to the memory array, the read/write circuitry including the pre-driver circuit and the driver circuit.

13. The apparatus of claim 9, wherein the pre-driver circuit further comprises a step-down transistor coupled between the pre-driver output node and a gate of the pull-down transistor, the step-down transistor configured to provide a voltage less than a second logic level voltage of the output signal during a first mode, the step-down transistor further configured to provide the second logic level voltage of the output signal to the gate of the pull-up transistor during a second mode.

14. The apparatus of claim 13 wherein the step-up transistor is further coupled to a gate of the step-down transistor.

15. An apparatus, comprising:
a driver circuit including a first transistor coupled to a first supply voltage and a second transistor coupled to a second supply voltage, the driver circuit configured to provide a driver output signal at a driver output node based on an output signal; and
a voltage step circuit coupled to the driver circuit, the voltage step circuit including a transistor configured to receive an output signal, the transistor coupled to at least one of a gate of the first transistor or a gate of the second transistor, during a first mode, the transistor configured to adjust a voltage provided to the at least one of the gate of the first transistor or the gate of the second transistor from a logic level voltage of the output signal, and wherein, during a second mode, the transistor further configured to provide the logic level voltage of the output signal to the at least one of the gate of the first transistor or the gate of the second transistor.

16. The apparatus of claim 15, wherein the transistor adjusts the voltage provided to the at least one of a gate of the first transistor or a gate of the second transistor based on a bias voltage received at a gate of the transistor.

17. The apparatus of claim 15, further comprising a pre-driver circuit configured to provide the output signal.

18. The apparatus of claim 15, wherein the transistor is a p-type transistor, wherein the transistor is configured to reduce the voltage provided to the at least one of a gate of the first transistor or a gate of the second transistor from the logic level of the output signal.

19. The apparatus of claim 15, wherein the transistor is a n-type transistor, wherein the transistor is configured to increase the voltage provided to the at least one of a gate of the first transistor or a gate of the second transistor from the logic level of the output signal.

20. The apparatus of claim 15, wherein the transistor is a first transistor and wherein the logical level voltage of the output signal is a first logic level voltage, wherein the first transistor is only coupled to the gate of the first transistor, the voltage step circuit further including a second transistor configured to receive the output signal, the second transistor coupled to the gate of the second transistor, during a first mode, the second transistor configured to adjust a voltage provided to the gate of the second transistor from a second logic level voltage of the output signal, and wherein, during a second mode, the second transistor further configured to provide the second logic level voltage of the output signal to the gate of the second transistor.

* * * * *